(12) United States Patent
Pines et al.

(10) Patent No.: US 8,570,042 B2
(45) Date of Patent: Oct. 29, 2013

(54) ADJUSTABLE PERMANENT MAGNET ASSEMBLY FOR NMR AND MRI

(75) Inventors: Alexander Pines, Berkeley, CA (US);
Jeffrey Paulsen, Berkeley, CA (US);
Louis S. Bouchard, Berkeley, CA (US);
Bernhard Blumich, Roetgen (DE)

(73) Assignee: The Regents of the University of California, Oakland, CA (US)

( * ) Notice: Subject to any disclaimer, the term of this patent is extended or adjusted under 35 U.S.C. 154(b) by 613 days.

(21) Appl. No.: 12/675,604

(22) PCT Filed: Aug. 29, 2008

(86) PCT No.: PCT/US2008/074925
§ 371 (c)(1), (2), (4) Date: Feb. 26, 2010

(87) PCT Pub. No.: WO2009/029896
PCT Pub. Date: Mar. 5, 2009

(65) Prior Publication Data
US 2010/0244828 A1 Sep. 30, 2010

Related U.S. Application Data

(60) Provisional application No. 60/969,492, filed on Aug. 31, 2007.

(51) Int. Cl.
*G01V 3/00* (2006.01)
*G01V 3/14* (2006.01)
(52) U.S. Cl.
USPC ........... 324/319; 324/309; 324/318; 324/320; 335/296; 600/410

(58) Field of Classification Search
USPC ........................... 324/300–322; 600/407–464
See application file for complete search history.

(56) References Cited

U.S. PATENT DOCUMENTS

| | | | |
|---|---|---|---|
| 6,534,984 B2 * | 3/2003 | Westphal | 324/318 |
| 6,537,196 B1 * | 3/2003 | Creighton et al. | 600/12 |
| 6,621,267 B1 * | 9/2003 | Damadian et al. | 324/319 |
| 6,977,503 B2 * | 12/2005 | Prado | 324/319 |
| 7,966,059 B2 * | 6/2011 | Creighton et al. | 600/427 |

(Continued)

OTHER PUBLICATIONS

Paulsen et al., Least Squares Magnetic-Field Optimization for Portable Nuclear Magnetic Resonance Magnet Design, IEEE Transactions on Magnetics, Dec. 2008, pp. 4582-4590, vol. 44, No. 12, IEEE.

(Continued)

*Primary Examiner* — Jermele M Hollington
*Assistant Examiner* — Emily Chan
(74) *Attorney, Agent, or Firm* — Knobbe, Martens, Olson & Bear LLP

(57) ABSTRACT

System and methods for designing and using single-sided magnet assemblies for magnetic resonance imaging (MRI) are disclosed. The single-sided magnet assemblies can include an array of permanent magnets disposed at selected positions. At least one of the permanent magnets can be configured to rotate about an axis of rotation in the range of at least +/−10 degrees and can include a magnetization having a vector component perpendicular to the axis of rotation. The single-sided magnet assemblies can further include a magnet frame that is configured to hold the permanent magnets in place while allowing the at least one of the permanent magnets to rotate about the axis of rotation.

18 Claims, 13 Drawing Sheets

(56) References Cited

U.S. PATENT DOCUMENTS

2003/0011451 A1* 1/2003 Katznelson et al. .......... 335/216
2005/0127908 A1 6/2005 Schlicker et al.
2005/0156596 A1 7/2005 Havens et al.
2006/0055404 A1 3/2006 Volke et al.
2006/0084861 A1 4/2006 Blank et al.
2006/0097725 A1* 5/2006 Callaghan et al. ............ 324/318
2007/0182413 A1* 8/2007 Blumich et al. .............. 324/318
2007/0194781 A1 8/2007 Zhitomirskiy

OTHER PUBLICATIONS

PCT, International Search Report and Written Opinion, for Application No. PCT/US 08/74925, dated Nov. 18, 2008.

\* cited by examiner

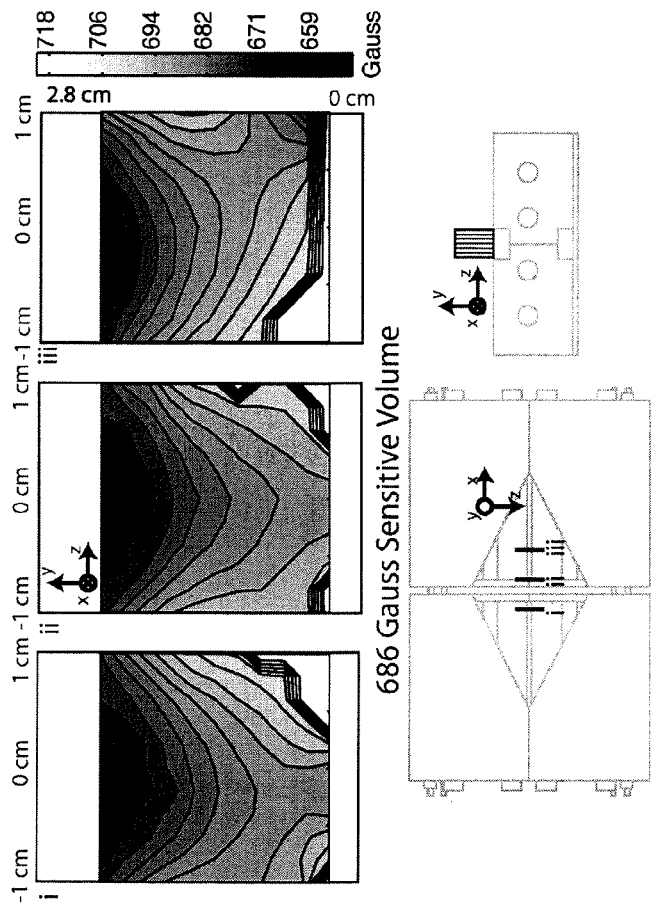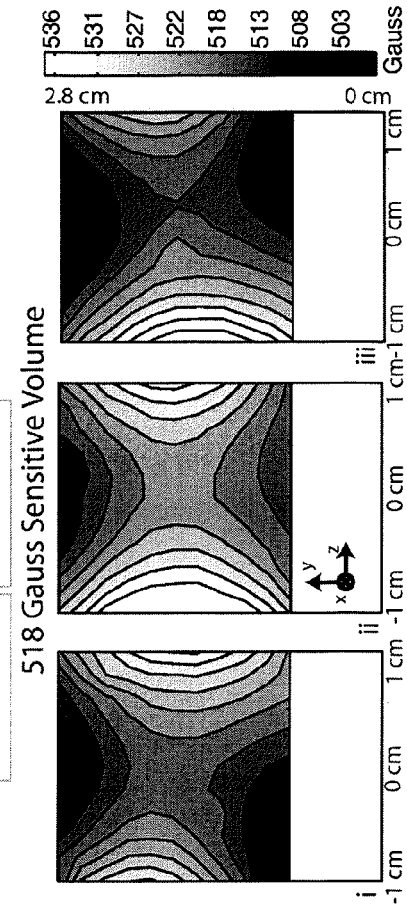
FIG. 7A
FIG. 7B

ADJUSTABLE PERMANENT MAGNET ASSEMBLY FOR NMR AND MRI

CROSS-REFERENCE TO RELATED APPLICATIONS

This application claims the benefit under 35 U.S.C. 119(e) of U.S. Provisional Application No. 60/969,492, entitled "Adjustable Permanent Magnet Assembly for Single-Sided Mobile NMR and MRI with a Large Tunable Sensitive Volume", filed on Apr. 31, 2007, which is incorporated by reference in its entirety.

STATEMENT REGARDING FEDERAL FUNDING

The present invention was made with U.S. Government support under Contract Number DE-AC02-05CH11231 between the U.S. Department of Energy and The Regents of the University of California for the management and operation of the Lawrence Berkeley National Laboratory. The U.S. Government has certain rights in this invention.

BACKGROUND OF THE INVENTION

1. Field of the Invention

The present invention relates to permanent magnets, and in particular, to adjustable permanent magnet assembly for nuclear magnetic resonance (NMR) and magnetic resonance imaging (MRI) applications.

2. Description of the Related Technology

During the last decade, a wide range of transportable, portable and single-sided NMR sensors and methodologies have been developed. The interest in such devices, as potential stand-alone or complementary alternatives to conventional MRI, arises from the obvious advantages of lower costs, portability, access to immovable arbitrary-sized objects, and scanning in the field. Mobile NMR measurements of, for example, relaxation times or MRI are conducted routinely in applications ranging from materials sciences to biomedicine. Recently, advances in methodology and hardware construction have allowed for high resolution NMR spectroscopy and medical imaging in one-sided, portable NMR/MRI systems.

Single-sided, portable systems feature strong magnets that produce either a remote homogeneous field or some type of natural gradient. The field homogeneity and size of the homogeneous region come at the expense of the size of these systems or the overall field strength. Magnets currently employed in portable NMR/MRI systems typically either have relatively small sensitive volumes, where the distance of this sensitive volume from the magnet often comes at the cost of field strength and hence signal, or have thin strips or slices of sensitive volume where the magnet's field usually has a strong gradient, which can cause a significant loss of signal with samples that have significant diffusion. With fixed magnets aiming for large sensitive volumes, as opposed to slices, one cannot tailor the field for specific applications, and, therefore, need to work with a fixed compromise between sensitive volume depth and field strength. For cases with fixed magnets one cannot adjust the field. With high gradient designs, the different volumes sampled by probe retuning are all high gradient and small volume. With a fixed sensitive volume magnet, one loses the low gradient large volume advantage if one doesn't work at that sensitive volume. Since field strength is sacrificed relative to a large gradient magnet to make a sensitive volume one, one has the disadvantages of both designs 1) low field, and 2) small volume large gradient when not working with the sensitive volume of the homogeneous volume type sensor.

SUMMARY OF CERTAIN INVENTIVE ASPECTS

The following detailed description is directed to certain specific embodiments. However, the teachings herein can be applied in a multitude of different ways. The embodiments may be implemented in any systems and methods that are configured to generate magnetic fields that are optimized for selected target regions. In particular, it is contemplated that the embodiments may be implemented in or associated with a variety of nuclear magnetic resonance (NMR) applications such as, but not limited to: pulsed-field gradient NMR, magnetic resonance imaging (MRI) tomography, NMR diffusion or velocity measurements, and portable low-field NMR or MRI devices for materials and biomedicine.

In one aspect, there is a single-sided magnet assembly that can include an array of permanent magnets. At least one of the permanent magnets can be configured to rotate about an axis of rotation in the range of at least +/−10 degrees and can include a magnetization having a vector component perpendicular to the axis of rotation. The single-sided magnet assembly can further include a magnet frame that is configured to hold the permanent magnets in place while allowing the at least one of the permanent magnets to rotate about the axis of rotation.

In another aspect, there is a magnetic resonance imaging (MRI) method. The MRI method can include providing an array of permanent magnets to one side an imaging object. The MRI method can further include selecting a target region. The MRI method can further include rotating one or more permanent magnets about one or more axes of rotation to one or more orientations to move a desired magnetic field sensitive volume from a first target region to the selected target region. The MRI method can further include performing an MRI measurement of the imaging object at the selected target region.

In another aspect, there is a magnetic resonance imaging (MRI) device. The MRI device can include an array of permanent magnets that are configured to rotate about one or more axes of rotation. The MRI device can further include a processor configured to select a target region, command one or more permanent magnets to one or more orientations to move a desired magnetic field sensitive volume from a first target region to the selected target region, and perform an MRI measurement at the selected target region.

In another aspect, there is a method of determining permanent magnet (PM) orientations in a PM array for magnetic resonance imaging (MRI). The method can include selecting a target region and target magnetic fields within the target region. The method can further include finding a minimum of a cost function representing a norm squared of a difference between the target magnetic fields and trial magnetic fields while constraining strengths of magnetizations of the permanent magnets (PMs). The method can further include determining a PM orientation for at least one of the PMs based at least in part on the constrained minimization.

BRIEF DESCRIPTION OF THE DRAWINGS

FIG. 7A shows a set of three slices of a sensitive volume's field map arising from an implementation of one of the optimal angles for one target volume FIG. 7B shows a set of three slices of a sensitive volume's field map arising from an implementation of the optimal angles of a more distant target volume (e.g., 1 cm).

DETAILED DESCRIPTION OF CERTAIN INVENTIVE EMBODIMENTS

Systems and methods for designing and implementing a novel adjustable permanent magnet (PM) assembly are disclosed. In certain embodiments, the systems and methods described herein provide a single-sided permanent magnet (PM) array for NMR or MRI applications in which the location of the sensitive or target region is adjustable. In some of such embodiments, the sensitive/target region of the single-sided PM array can be adjusted by rotating one or more PM rods magnetized perpendicular to their axes of rotation.

I. Single-Sided Permanent Magnet (PM) Array Design

A. An Example Single-Sided Permanent Magnet (PM) Array

Figure 1A:
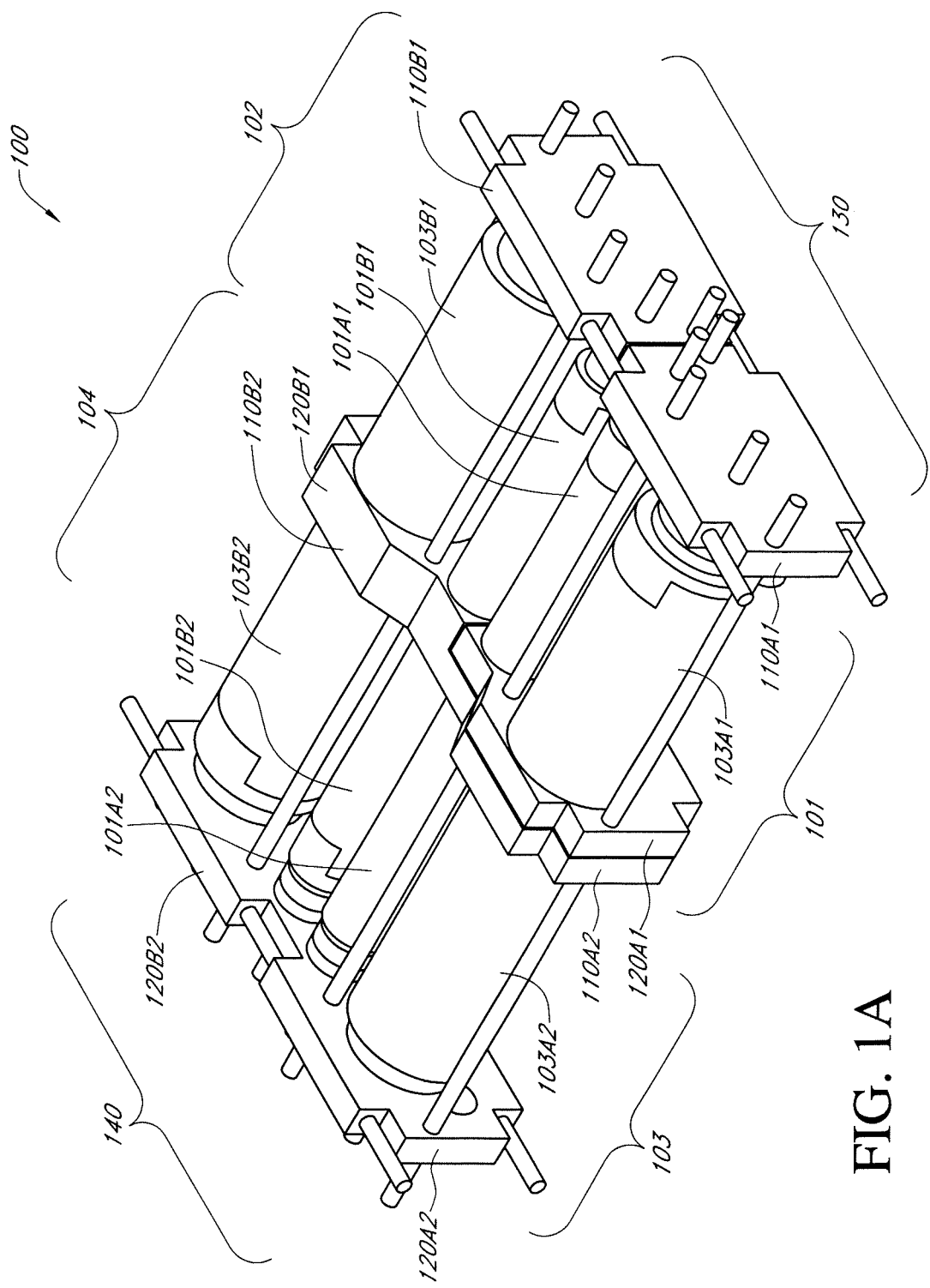
FIG. 1A is a perspective diagram of an illustrative single-sided permanent magnet (PM) array in its fully assembled state.
Figure 1B:
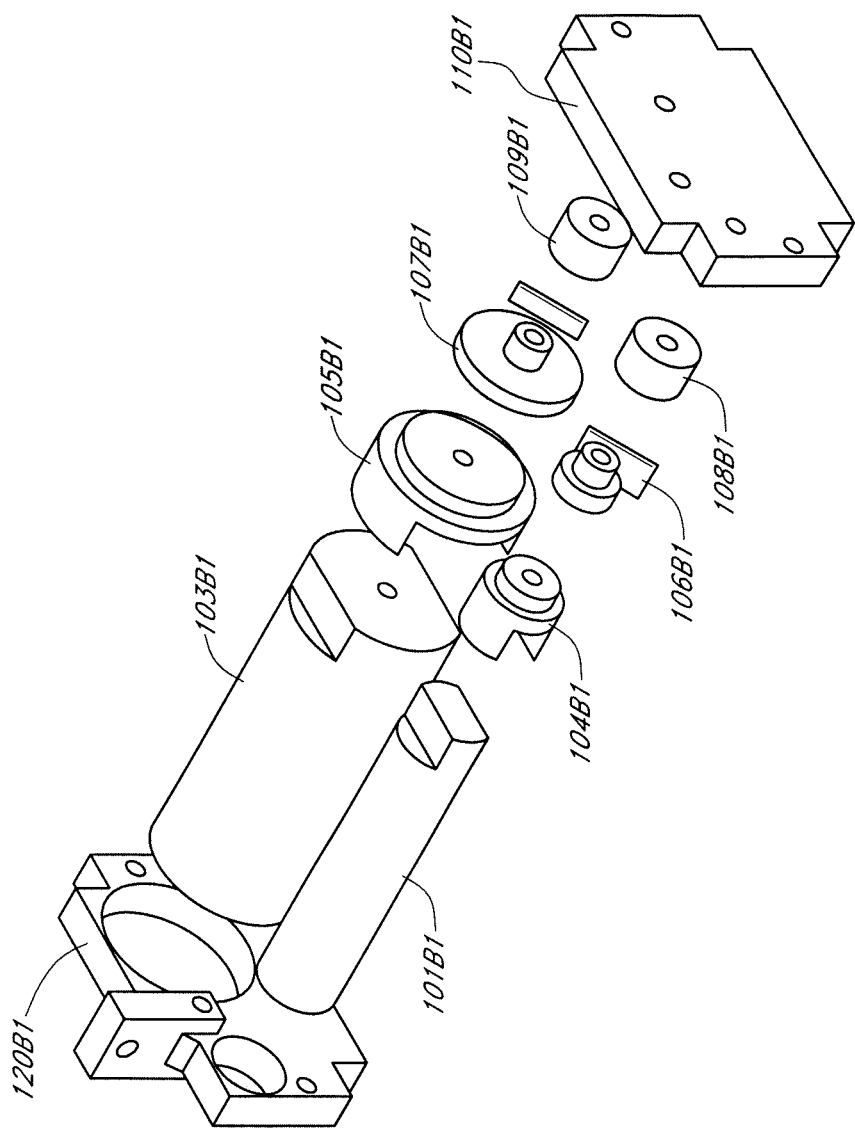
FIG. 1B provides an exploded perspective view of a quadrant of the single-sided PM array shown in FIG. 1A.
Figure 1C:
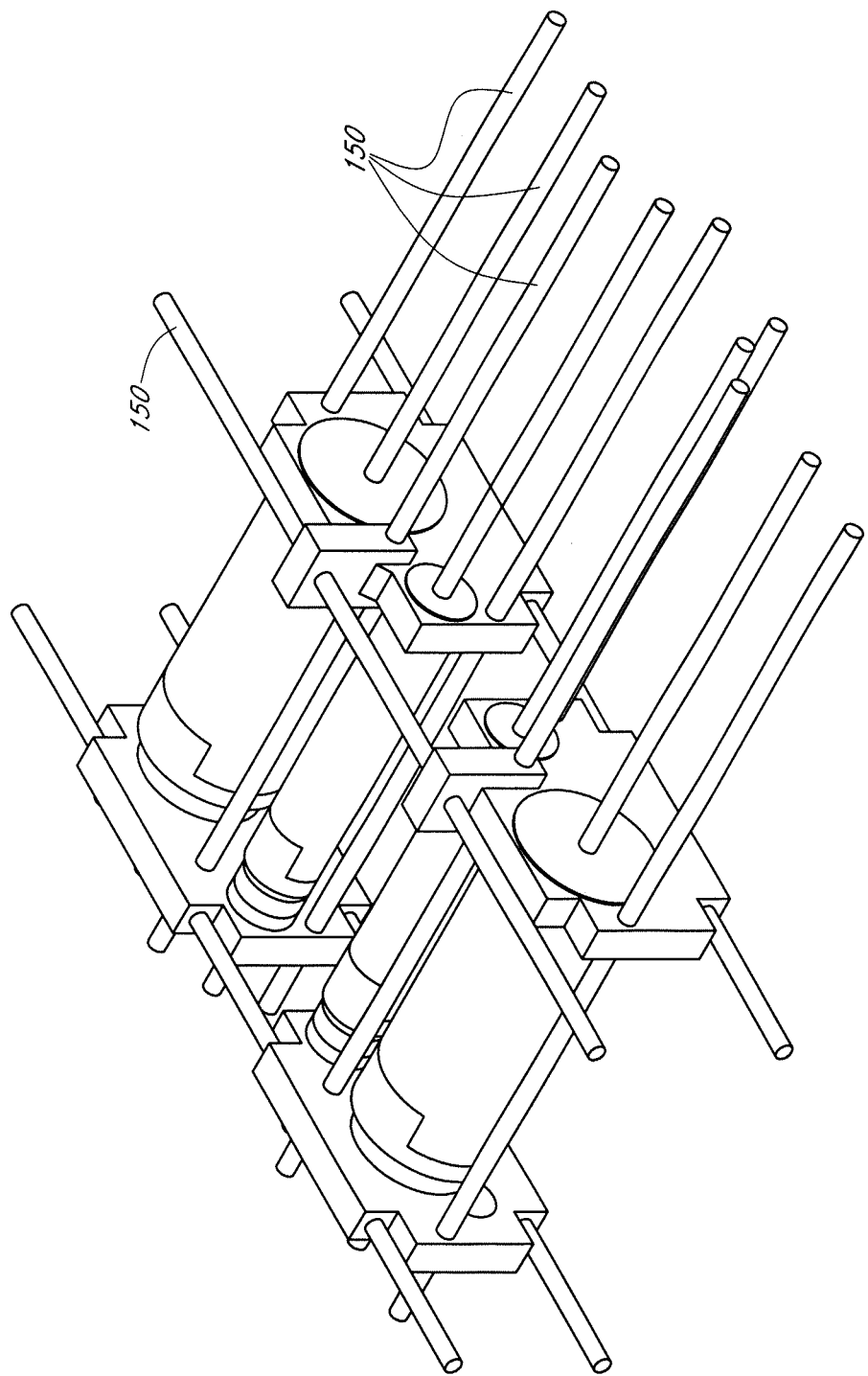
FIG. 1C provides a perspective view illustrating how multiple quadrants of the single-sided PM array are assembled together along an array of threaded rods.

FIGS. 1A, 1B, and 1C show diagrams illustrating a construction of a single-sided PM array implemented in an example magnet frame 100 according to one embodiment. FIG. 1A is a perspective diagram of the single-sided PM array comprising a magnet frame 100 in its fully assembled state. The magnet frame 100 comprises four quadrants 101, 102, 103, 104. The first and second quadrants 101, 102 comprise a first PM module 130, and the third and fourth quadrants 103, 104 comprise a second PM module 140. The first PM module 101 comprises four dipoles—two inner cylindrical PM rods 101A1, 101B1 and two outer cylindrical PM rods 103A1, 103B1—positioned according to an optimized arrangement to be described below. The first PM module 101 further comprises front walls 110A1, 110B1 and back walls 120A1, 120B1, which provide support for the PM rods in the first PM module 101. The second PM module 102 likewise comprises four dipoles—two inner cylindrical PM rods 101A2, 101B2 and two outer cylindrical PM rods 103A2, 103B2—positioned according to an optimized arrangement. The second PM module 102 further comprises front walls 110A2, 110B2 and back walls 120A2, 120B2, which provide support for the PM rods in the second PM module 102. The front and back walls can be made from a nonmagnetic metal such as stainless steel, aluminum, or titanium, for example. In some embodiments, the single-sided PM array is covered with adjoining metal (e.g., aluminum) plates on the sides and bottom and optionally the top to prevent magnetic debris from getting attracted to and stuck to the PM rods.

Permanent magnet rods that can be used for the inner and outer cylindrical PM rods are available at low cost from many commercial vendors in several different sizes, e.g., diameters and lengths, and magnetization strengths and directions. In certain embodiments, the magnetization direction is substantially perpendicular (e.g., within +/−5%) to the cylindrical axis (e.g., parallel to the radial direction). In other embodiments, the magnetization direction of one or more of the inner and outer cylindrical PM rods can have axial and/or circumferential components. In one example construction, the diameter of the outer cylindrical PM rods 103A1, 103B1, 103A2, 103B2 is about 40 mm, while the diameter of the inner cylindrical PM rods 101A1, 101B1, 101A2, 101B2 is 20 mm. In the embodiment, the length of both inner and outer cylindrical rods is about 90 mm.

It is worth noting that the single-sided PM array shown in FIGS. 1A, 1B, and 1C actually comprises 8 PM rods of equal lengths (e.g., 90 mm), which may be considered as forming four sets of magnetic dipoles. For example, PM rods 103A1 and 103A2 form a first outer magnetic dipole, and the PM rods 101A1 and 101A2 form a first inner magnetic pole. Each dipole comprising two PM rods includes a short nonmagnetic gap of about 0.5 cm in between. This arrangement of dividing the frame into four parts can make the field assembly of the PM array easier and safer, and the short nonmagnetic gap provided between the sub PM rods [provides a more homogeneous sensitive volume (widening it along the direction of the rod axes) than what (e.g., 180 mm) PM rods without nonmagnetic gaps could provide. The nonmagnetic gap can be in the range of about 0% to about 20% of the combined length of each magnetic dipole, preferably in the range of about 1% to about 15%. In one embodiment involving 90 mm length PM rods, the gap was 0.5 cm. In the limit of a small gap relative to the length, a smaller gap limits homogeneity along the direction of the PM axes while a larger gap limits field strength.

FIG. 1B provides an exploded perspective view of a quadrant of the magnet frame 100 (e.g., the quadrant 102) shown in FIG. 1A. FIG. 1B shows (in addition to the PM rods 101B1, 103B1 and front and back walls 110B1, 120B2) endcaps 104B1, 105B1, gears and worms 106B1, 107B1, and spacers 108B1, 109B1, for providing support and/or rotability of the inner and outer cylindrical PM rods 101B1, 103B1, respectively. FIG. 1C provides a perspective view illustrating how multiple quadrants of the magnet frame 100 are assembled together along an array of threaded rods 150.

The magnet frame 100 can hold the cylindrical PM rods in place while allowing them to rotate. The four quadrant design with the guide rods 150 allows for safe and easy assembly.

The gear and worm drive (e.g., 106B1, 107B1) for each of the inner and outer PM rods (e.g., 101B1, 103B1) allows for adjustments to the PM rods' orientations while exterior nuts (not shown) help to hold the PM rods in place. Within each quadrant, the smaller (e.g., inner) and larger (e.g., outer) PM rods may be inserted together with reasonable safety given a non-magnetic shim with an appropriate thickness to prevent them from crashing together. In order to combine the four quadrants, there are holes and attachable devices that allow for them to be gradually and safely brought together using threaded rods and nuts. During assembly, a Plexiglass (e.g., 1 cm thick) may be positioned between two PM rods when placing them into each of the frame's quadrants.

As described in more detail below, the rotatability of the cylindrical PM rods allows for a movement or an adjustment of the target region, e.g., a sensitive volume having a desired magnetic field, in an NMR or MRI measurement. In general, any number of permanent magnet shapes and positions within an array may provide for adjustability of the target region when one or more of the magnets are rotatable about an axis with magnetizations at a non-zero angle to the axis of rotation. In some embodiments, one or more inner or outer cylindrical PM rods can rotate in the range of at least about +/−5 degrees to effectuate the movement of the sensitive volume. In other embodiments, the range can be at least about +/−10 degrees. In yet other embodiments, the range can be at least about +/−20 degrees. In yet other embodiments, the range can be about +/−50 degrees. In yet other embodiments, the range can be at least about +/−90 degrees.

In general, any suitable shape of magnet may be used. The term "PM rod," as used herein, refers to a bar comprised of a permanent magnet, such as for example a ceramic, Alnico, or rare earth magnet, which bar is characterized by a length and a cross section, the length being greater than a characteristic dimension (e.g., diameter, diagonal, perimeter and the like) of the cross section, wherein the bar's aspect ratio (e.g., the ratio of the length to the characteristic dimension) is at least about 3:1, 4:1, 5:1, 7:1, 10:1, 15:1, 20:1 or 50:1. In some embodiments, the bar has the same cross section throughout the length. In other embodiment, the cross section may vary in size throughout the length. In certain embodiments, the length direction of the bar is along a straight line. In other embodiments, the length direction is along a curve such as a full or semi-circle thereby forming a full or a half toroid, for example. In some embodiments, the PM rods include cylindrical PM rods (that is, linear PM rods having circular cross sections) magnetized perpendicularly to their axes. The cylindrical PM rods can have an aspect ratio (length/diameter) in the range of 2 to 100. In some embodiment, the aspect ratio is between 2 and 5. In other embodiments, the aspect ratio is in the range of 5 to 20.

B. Least Squares Magnetic-Field Optimization Methodology

1. Original PM Array Design

A least-squares magnetic-field optimization adapted for design of an array of permanent magnets such as the single-sided PM array illustrated in FIGS. 1A-1C is now described. The optimization minimizes the norm squared of the difference between the trial and target fields for an array of PM blocks. A choice of basis functions which consists of infinitesimal two dimensional dipoles (e.g., $\hat{z}$ and $\hat{y}$) located at a predetermined set of positions yields a solution whose expansion coefficients have a direct physical meaning for permanent magnet construction. If desired, the dipole positions themselves can be optimized by global searches on a discrete grid.

To generate a field $\vec{B}(r)$ that best matches a target field, $\vec{t}(r)$, in the sense of least squares, the following cost function, which is a volume integral of the norm squared of the difference between the fields over a region of interest (ROI), can be minimized:

$$C = \int_V \left\| \vec{B}(r) - \vec{t}(r) \right\|^2 dr \tag{1}$$

This function, Eq. (1), can be expanded into a sum of several dot products. A trial field $\vec{B}(r)$ produced by an array of PM blocks can be described or expressed as a linear combination of basis fields consisting of two superimposed orthogonal two-dimensional infinitesimal dipoles at each magnet position.

$$\vec{B}(r) = \sum_m g_m \vec{b}_m(r), \tag{2}$$

where $g_m$ represent magnetization coefficients to be optimized and $\vec{b}_m$ represent basis fields associated with the array of PM blocks. For long cylinders uniformly magnetized perpendicularly to their axes, a linear combination of $\hat{x}$ and $\hat{y}$ oriented 2 dimensional dipoles centered at the appropriate position can describe each permanent magnet's strength and orientation, and an infinitely long cylinder uniformly magnetized perpendicular to its axis can exactly reproduce this field. For each PM block, there are two m indices for the magnetization or dipole coefficients, corresponding to the x and y components of its magnetization. Therefore, the m index of Eq (2) ranges from 1 to 2N where N corresponds to the total number of PM blocks. For example, $g_m$ consist of $g_{1x}$, $g_{1y}$, . . . , $g_{kx}$, $g_{ky}$, . . . , $g_{Nx}$, $g_{Ny}$, where $g_{kx}$, $g_{ky}$, represent a pair of x and y dipole coefficients for $k^{th}$ PM block. The cylinder's field strength can be scaled to match the dipole's without changing the shape of the field outside of it by scaling its radius as the square root of the dipole's strength. The field of such a cylinder magnetized along the x-axis is given in cylindrical coordinates by Eq (3), where $B_r$ is the remnant field of the PM block, R is the cylinder's radius, and s and θ are the radial and angular coordinates, respectively.

$$B = B_r R^2 / 2s^2 (\cos(\theta)\hat{s} + \sin(\theta)\hat{\theta}) \tag{3}$$

It should be noted, however, that the scaling of the radius to a power of the dipole's strength is limited to specific cases (e.g. sphere and infinite length cylinder). When this condition is not satisfied or not approximated by the shape (e.g., for a target region near the center of a cylinder, an infinite length rod can be approximated by a sufficiently long finite length cylinder), an exact solution subject to the quadratic equality constraints and magnetization orientation optimizations to be described below needs to be used instead of a linear combination of basis functions described above.

Thus, an optimal set of coefficients can have a direct translation as oriented two-dimensional dipoles that can be physically reproduced with sufficiently long cylinders magnetized perpendicularly to their axes. By substituting the basis representation, Eq. (2), into the cost function, Eq. (1), and applying the appropriate algebraic manipulations, the cost function can then be expressed in matrix form:

$$C = g^T M g - 2 g^T m + t \tag{4}$$

where g is a 2×n matrix having 2×n $g_m$ coefficients, $$t = \left( \int_V \vec{t}(r) \cdot \vec{t}(r) \right)$$

is a scalar term, M is an n×n matrix and m an n long vector, n being the number of basis fields, and these are defined by the appropriate overlap integrals:

$$M_{i,j} \equiv \int_V \vec{b}_i(r) \cdot \vec{b}_j(r) dr \quad m_i \equiv \int_V \vec{b}_i(r) \cdot \vec{t}(r) dr \tag{5}$$

To determine the extrema with respect to variations in the linear coefficients $\{g_i\}$, Eq. (4) is differentiated to obtain:

$$\frac{\partial C}{\partial g_k} = \sum_i 2M_{k,i} g_i - 2m_k. \tag{6}$$

Setting Eq. (6) equal to zero for all possible k yields a single matrix equation:

$$g = M^{-1} m. \tag{7}$$

If M is not singular and hence the basis fields are linearly independent, the optimal solution is optimal for the given basis and region of optimization. This point, when it exists, is a global minimum with respect to $\{g\}$, because the original cost function, Eq. (1), is bounded from below and is quadratic with respect to the optimized coefficients. If M is an ill-conditioned or even a singular matrix, or yields unrealizable or inefficient designs then matrix regulation or constrained optimization can overcome these issues.

The results of the optimizations are optimized dipole coefficients $g_m$. Each pair of x and y dipole coefficients corresponding to each PM block provides its orientation and magnetization strength necessary to provide the target field $\vec{t}(r)$. For example, $\sqrt{g_{kx}^2 + g_{ky}^2}$ provides the magnetization strength and $\text{Tan}^{-}[g_{kx}/g_{ky}]$ provides the orientation of the $k^{th}$ PM block.

2. Constrained Dipole Orientation Optimizations

Once an array of permanent magnets (PMs) having certain magnetization strengths and orientations for an initial target field at an initial target region is determined using the above procedure, subsequent dipole orientation optimizations may be performed to determine PM orientations sufficient to produce alternative target fields at alternative target regions.

Tasks such as determining optimal magnetization angles given fixed PM block shapes, positions and strengths; or reproducing a different field with a pre-existing adjustable magnet using a rod (e.g., cylindrical PM blocks) implementation scheme can require calculating optimal dipole orientations given fixed strengths. Here, the cost function, Eq. (4), can be optimized under the equality constraints, Eq. (8), where each $\alpha_j^2$ is a positive scalar fixing a rod's magnitude and the n×n matrices $K_j$ are symmetric and positive definite where n is the number of basis fields.

$$\{\alpha_j^2 = g^T K_j g\}. \tag{8}$$

The constrained optimum can be determined via the method of Lagrange multipliers. The Lagrangian is $$\varphi = g^T M g - g^T m + \sum_j \lambda_j (g^T K_j g - \alpha_j^2), \tag{9}$$

where $\lambda = \{\lambda_1, \lambda_2, \kappa, \lambda_n\}$ are the Lagrange multipliers. The extrema of Eq. (9) is obtained when its gradient with respect to g is zero, and is given by:

$$g_{opt} = \left( M + \sum_j \lambda_j K_j \right)^{-1} m. \tag{10}$$

where the fact that M and $K_j$ are symmetric matrices is used. Finding zeros of the derivative can locate local extrema (local minima and maxima) or saddle points. That is, the zeros may not represent may global minima or maxima (true extremes) of the cost function. Since the form of the Lagrangian is the same as the original cost function, this is still equivalent to Eq. (7) but with a modified matrix, namely, $$M' = \left( M + \sum_j \lambda_j K_j \right)^{-1}$$

Solving for the Lagrange multipliers ($\lambda_j$), by substituting the solution for g into the constraints (8), yields an expression that does not have a trivial solution. A Newton-Raphson algorithm can be applied to solve for $\lambda$, for example. The optimal coefficients, Eq. (10), can be approximated by substitution into the constraints, Eq. (8), to first order in $\lambda$. Specifically, the matrix equation $(1-\alpha A)^{-1}$ can be approximated by $1+\alpha A$ for small values of $\alpha$. Thus, to first order in $\lambda$, the optimal coefficients are:

$$g_{opt} = M^{-1} m - \sum_j \lambda_j M^{-1} K_j M^{-1} m. \tag{11}$$

Then our constraints can be approximated by:

$$\alpha_k^2 = (M^{-1} m)^T K_k (M^{-1} m) - 2 \sum_j \lambda_j (M^{-1} m)^T K_k M^{-1} K_j (M^{-1} m). \tag{12}$$

which results from substituting Eq. (13) into Eq. (10) and retaining only the zeroth and first order terms in $\lambda_j$.

Solving the solution for $\lambda$ now reduces to solving a matrix equation:

$$L\lambda - \rho = -A, \tag{13}$$

where $A_j = \alpha_j^2$ $\rho_j = (M^{-1} m)^T K_j (M^{-1} m)$ $L_{i,j} = 2(M^{-1} M)^T K_i M^{-1} K_j (M^{-1} m)$.

The $\lambda$ obtained is not an exact solution, so the constraint is not immediately satisfied. It is nonetheless closer to the constrained optimum than the initial unconstrained solution $M^{-1} m$. To improve the compliance, the constraint methodology can be applied iteratively to the cost function modified by the most recent Lagrangian, (16).

$$^{i+1}M = {^i}M + \sum_j {^i}\lambda_j K_j. \quad (14)$$

To match to a particular field, it is often the vector field itself rather than its magnitude that is fitted. However, with equality constraints placed on the coefficients, their overall magnitude cannot adjust to best match the strength of the target field. This flexibility may be retained for quadratically constrained optimizations by placing a variable scalar term in the target field overlap vector m, substituting it with sm, and subsequently determining the optimal value for s. With this substitution, the iterative first order equation for λ becomes:

$$L\lambda - \rho = \frac{1}{s^2}A. \quad (15)$$

The general solution (16) follows if λ is decomposed into the partial solutions $\lambda_p$ and $\lambda_A$.

$$\lambda = \lambda_p - \frac{1}{s^2}\lambda_A \quad (16)$$
$$\rho = L\lambda_p$$
$$A = L\lambda_A$$

The optimal match occurs when the original cost function is minimally perturbed so that the optimal solution obeys the constraints, and hence when |λ| is minimized with appropriately defined constraint matrices $K_k$. By explicitly writing out the norm of λ as a scalar product of its solution and differentiating with respect to the field scalar, s, the optimum is attained for:

$$s = \sqrt{\frac{\lambda_a \cdot \lambda_a}{\lambda_a \cdot \lambda_p}} \quad (17)$$

Equation (17) has no solutions when $\lambda_a \cdot \lambda_p \leq 0$. This condition would imply that an infinitely strong field would be optimal, a physically unrealistic situation given the application of finding optimal dipole orientations that matches a particular field. However, this condition can nonetheless arise in optimizations, and implementations of this technique should be careful to handle this condition.

It is worth noting that the dipole orientation optimizations or the magnetization orientations for arbitrary shapes described above are constrained optimizations in the sense that they are subject to the quadratic equality constraints. That is, the sum of the magnitudes of the $g_{kx}$ and $g_{ky}$ coefficients for each PM are fixed although their relative magnitudes are variable. This is in contrast to the PM design optimizations described in Section B-1 which are unconstrained optimizations in the sense that both the sum of the magnitudes and the relative strengths of the $g_{kx}$ and $g_{ky}$ coefficients are variable. Although the above-described optimizations utilize a particular least-squares minimization technique, it will be appreciated that any number of minimization techniques known in the art may be used to optimize a PM array. The use of orthogonal basis functions to describe the orientation and strength of each permanent magnet may be used in any such optimization techniques.

3. Computer Implementations

The design methodology, based on the above-described least-squares magnetic-field optimization adapted for an array of PM blocks, can be implemented on a computer as a computer algorithm. The user can specify a target region (e.g., a volume or a slice) and target field, and the algorithm outputs a globally optimal dipole arrangement based on desired trade-offs between design efficiency and accuracy. The computation can be reduced to the determination of overlap integrals and matrix inversion.

An alternative algorithm of the least squares design methodology is now described. The original cost function, Eq. (1), with the basis set expansion directly applied to it is:

$$C = \int_v \|\Gamma(r)g - t(r)\|^2 dr. \quad (18)$$

where g is the vector of linear weightings, Γ(r) is a matrix whose columns represent different basis functions and whose rows represent different components of the field, and t(r) is the target field. If the minimization is over a discrete set of points {p} and the field's components are Cartesian, the integral of the norm becomes a sum of the square of the field's vector components.

$$C = \sum_{\{p\}} \sum_{\{a\}} [\Gamma(p)g - t(p)]_a^2. \quad (19)$$

The sum over points can be combined with the sum over field components to create a simplified matrix expression, Eq. (22), if the rows of F and t are allowed to span a more general space that sequentially lists the field components of every point.

$$C = \|\Gamma g - t\|^2 \quad (20)$$

The optimal solution here is the classic least-squares fitting problem of linear algebra, for which there are many pre-existing routines. The matrix Γ can be the same as the one used in the $l_p$-norm method to relate constraints placed on the field to constraints on the optimal currents as described in *IEEE Transactions on Magnetics*, Vol. 36, No. 2, pp. 476-483, 2000, which is incorporated herein by reference in its entirety.

II. Application to a Single-Sided Permanent Magnet (PM) Array Design

The least-squares design methodology described in Section I above can be used to design a single-sided permanent magnet (PM) array. As used herein, the "single-sided PM array" refers to an array of PM blocks in which a target or sensitive volume having a target field of interest is located on one side of the PM array at a target distance away from the PM array. Such a single-sided PM array can be used as a source of polarizing and/or gradient magnetic fields in a portable NMR/MRI device. All optimizations and field plots were computed with Matlab (The Mathworks, Natick, Mass.). The Matlab solutions for the proposed single-sided NIVIR array were checked using Comsol33's magneto-statics module (The COMSOL Group, Stockholm, Sweden) for consistency. A series of unconstrained optimizations identified an optimal magnet geometry and orientation of the magnet rods, which was then characterized by finite element modeling. Subsequent (constrained) optimizations demonstrate that sensitive (target) volume can be moved or changed by simply rotating the magnetic rods.

A. PM Array Design Optimization and Simulation

For the purpose of the following illustration of the application of the least-squares design methodology as applied to a single-sided PM array, it is assumed that the single-sided PM array includes a plurality of PM blocks as physically reproducing the oriented two-dimensional dipoles discussed in Section I-A with respect to Equation (2). In certain embodiments, the PM blocks include sufficiently long PM rods. The single-sided PM array comprising the four cylindrical PM rods was optimized for position over a coarse grid via a global search, where the appropriate dipole position symmetries were enforced, and the dipole strengths and orientations were optimized for each arrangement via the least-squares optimization method described in Section I above.

Figure 2:
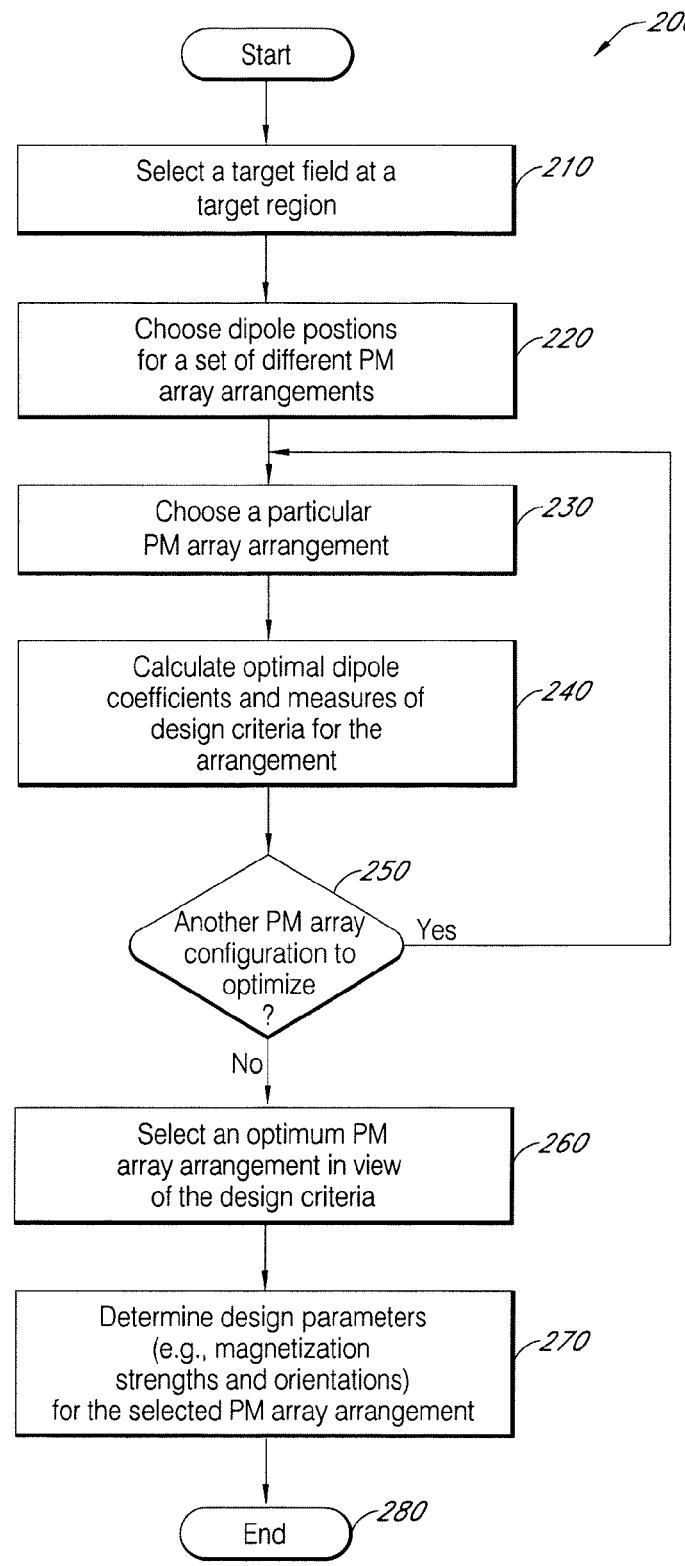
FIG. 2 shows a flowchart illustrating an example process for an unconstrained least-squares optimization method for arriving at a design for an array of permanent magnet (PM) rods.

FIG. 2 shows a flowchart illustrating an example process 200 for an unconstrained least-squares optimization method for arriving at a design for an array of permanent magnet (PM) rods such as the single-sided PM array illustrated in FIGS. 1A, 1B, and 1C. The optimization method is "unconstrained" in the sense that both the magnitudes and orientations of the magnetizations for the dipoles are variable. The process 200 starts at a state 210, where a target field at a target region (e.g., volume or slice) is selected. The process 200 proceeds to a state 220, where possible dipole positions, such as for example the dipole positions 310 shown in FIG. 3, for different possible PM array arrangements are chosen. The process 200 proceeds to a state 230, where a particular PM array arrangement is chosen for the unconstrained optimization. The process proceeds to a state 240, where optimal dipole coefficients and measures relating to various design criteria, such as homogeneity, efficiency, and stability, are computed. The computation of the optimal dipole coefficients can include computations involving M matrix and m vector as described below with respect to Eqs. (5) and (7). Some example measures relating to various design criteria are described with respect to Algorithm 2 and Table 1 to be described below. The process 200 proceeds to a state 250, where it is queried whether there is another PM array configuration among the set of possible PM arrangements to be optimized. If the answer is YES, the process 200 loops back to the state 230 where another PM array arrangement is chosen to be optimized. If the answer is NO, the process 200 proceeds to the state 260, where an optimum or best PM array arrangement is selected from the set of possible PM array arrangements (e.g., dipole positions) based at least in part on optimized dipole coefficients and/or various measures of the design criteria. In some embodiments, the selection process includes ranking the optimal arrangements according to the design criteria first. The process 200 proceeds to a state 270, where design parameters such as magnetization strengths (and corresponding lengths and/or diameters) and orientations for the PM rods for the selected (e.g., 1,3) arrangement are determined based on the optimal dipole coefficients. The process 200 ends at a state 280.

In one non-limiting example of the above-described array design procedure, optimal dipole strengths and orientations were optimized for a series of possible placements of 4 dipoles via the least-square optimization method described above. The optimal positions were chosen by selecting the best of these possible arrangements.

Algorithms 1 and 2 shown below describe an example optimization scheme. In the example optimization scheme, Algorithm 1 can be used for determining the appropriate weighting for the "zero-field," while Algorithm 2 can be used for a global search for optimizing a dipole array:

---
Algorithm 1

1: Choose a representative set of dipole positions $\{x_i\}_0$.
2: Calculate the target field matrix and vector, M and m, and the zero-field matrix $M_z$ ($m_z = 0$) from Eq. (5).
3: repeat
4:     Appropriately set or adjust the zero field cost factor, $f_z$.
5:     Calculate the effective cost function to be minimized.
      $M_{eff} = (1 - f_z) M + f_z M_Z$, $m_{eff} = (1 - f_z) m$.
6:     Determine the optimal coefficients, $g_{opt} = M_{eff}^{-1} m_{eff}$.
7: until the homogeneity is in the target range or close as possible to it.

---
Algorithm 2

1: Determine the appropriate zero-field weighting, $f_z$ as in Algorithm 1.
2: Determine the distinct sets of dipole positions, $\{x_k\}_l$, to be tested.
3: for all $\{x_k\}_l$ do
4:     Calculate the target field matrix and vector (M and m) and the zero-field matrix ($M_z$) where $m_z = 0$ from Eq. (5).
5:     Calculate the effective cost function to be minimized.
      $M_{eff} = (1 - f_z) M + f_z M_z$, $m_{eff} = (1 - f_z) m$.
6:     Determine the optimal coefficients, $g_{opt} = M_{eff}^{-1} m_{eff}$.
7:     Calculate the approximate homogeneity, C', the efficiency measure $\|g\|^2$, and its resilience to variations,
      $|\nabla_x C'| \approx \sqrt{\sum_\alpha ([C'(x_\alpha + \delta) - C'(x_\alpha)]/\delta)^2}$ and
      $|\nabla_g C'| \approx \sqrt{\sum_\alpha ([C'(g_\alpha + \delta) - C'(g_\alpha)]/\delta)^2}$ where C' is the cost function in Eq. (4) for the main target field.
8: end for
9: Rank the systems for optimal homogeneity, efficiency and stability.
10: Choose the best compromise system.

---

Figure 3:
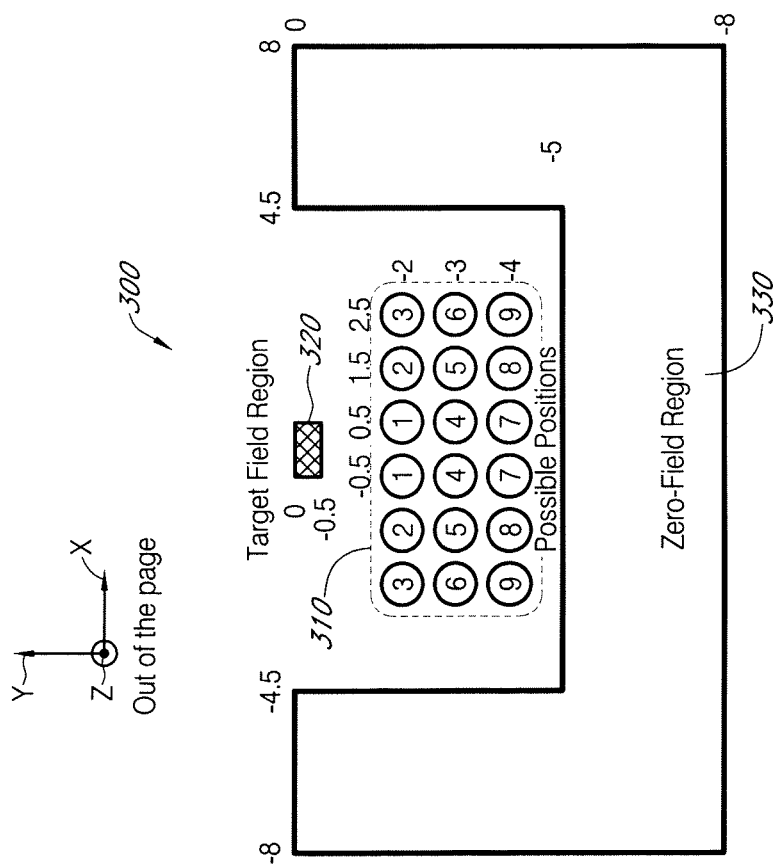
FIG. 3 shows a diagram illustrating an example single-sided PM array that includes possible dipole positions for cylindrical PM rods, a target-field region, and a field-zeroing region.

FIG. 3 shows a diagram illustrating an example single-sided PM array 300 that includes possible dipole positions 310 for cylindrical PM rods, a target-field region 320, and a field-zeroing region 330. It is assumed that the cylindrical PM rods have magnetizations perpendicular to their axes. Dipole orientations and strengths were optimized for the target field of unit strength and oriented parallel to the plane (e.g., x-z plane). In the example optimization, an additional optimization matrix and vector based on a zero target field over the field-zeroing region 330 were added at a small scaling factor determined by Algorithm 1 ($f_z=1.6\times10^{-4}$) to the main target field's optimization matrix and vector before calculating the optimal coefficients to make the inverted matrix less ill-conditioned and improve the design's efficiency.

While the single-sided PM array described above focused on cylindrical PM rods that are configured to rotate about their axes and whose magnetizations are perpendicular to the axes of rotation, it should be appreciated in light of the present disclosure that other configurations are also possible. For example, triangular, square, rectangular, or hexagonal PM rods can be used in lieu of or in addition to the cylindrical PM rods. In some embodiments, one or more of the PM rods in the array may have one or more magnetization components (e.g., axial or circumferential components) that are not perpendicular to their axes. In other embodiments, some or all of the magnet rods can be electromagnets instead of permanent magnets. In other embodiments, the single sided PM array may include permanent magnets (PM) blocks, e.g., cubes, cuboids, spheres, octahedrons, pyramids, prisms, parallelepipeds, and the like, that are rotatable about one or more axes of rotation. In some of such embodiments, the PM rods or PM blocks may be configured to rotate in multiple axes of rotation. For example, the PM block, e.g., a sphere, mounted on a set of two or more gimbals such that the magnetization for the PM block can be rotated to an arbitrary (e.g., Euler) angle.

From a set of possible dipole positions 310, each with optimized dipole strengths and orientations, the best arrangement in terms of various design criteria such as homogeneity, efficiency, and stability, for example, can be selected. The homogeneity can be calculated at the RMS deviation on the field from the target field, which is $\sqrt{C}/A$, where C is the cost function given by Eq. (4) and A is the area for the main target field. Eq. (3) can determine the field strength at the center of the target region for the rod radii and orientations corresponding to the optimal coefficients. The efficiency can be measured from the sum of squares of the optimal dipole coefficients ($\|g\|^2$) or the design's resulting PM implementation and associated field strength, for example. The stability of a set of dipole positions can be based on the magnitude of the gradient of the cost function with respect to changes in dipole position and magnetization ($|\nabla_x C|$ and $|\nabla_g C|$ respectively), and can be calculated by finite differences between the position's optimal design and its perturbations. It should be appreciated in view of the present disclosure that the optimal dipole positions can be chosen based on certain design criteria in addition to or in lieu of the homogeneity, efficiency, and stability. It should be also appreciated that the measures of the criteria of homogeneity, efficiency, and stability, described above, are for examples only, and other measures can be used to determine the criteria.

Table I provided below lists the best 5 solutions for homogeneity, efficiency, and stability. (The best 5 solutions are for dipole configurations illustrated in FIG. 3, having four dipoles and the target and zero fields and $f_z=1.6\times10^{-4}$.) The numbers under arrangement refer to the PM positions labeled in FIG. 3 that are occupied. Each number refers to two positions which could be occupied by a pair of PMs.

TABLE I

| $\frac{\sqrt{C'}}{A}(10^{-2})$ | $|\nabla_x C| (10^{-5})$ | $|\nabla_g C| (10^{-5})$ | $\|g\|^2$ | Arrangement |
|---|---|---|---|---|
| Top Field Matches | | | | |
| 0.68 | 4.8 | 0.78 | 239 | 2,3 |
| 0.81 | 5.2 | 0.83 | 108 | 1,3 |
| 0.86 | 8.5 | 1.10 | 202 | 3,5 |
| 1.05 | 5.0 | 0.79 | 126 | 3,4 |
| 1.07 | 9.3 | 1.61 | 441 | 2,6 |
| Most Stable with Respect to Position | | | | |
| 0.68 | 4.8 | 0.78 | 239 | 2,3 |
| 1.05 | 5.0 | 0.79 | 126 | 3,4 |
| 0.81 | 5.2 | 0.83 | 108 | 1,3 |
| 1.38 | 7.1 | 1.03 | 455 | 2,5 |
| 0.86 | 8.5 | 1.10 | 202 | 3,5 |
| Most Stable with Respect to Magnetization | | | | |
| 0.68 | 4.8 | 0.78 | 239 | 2,3 |
| 1.05 | 5.0 | 0.79 | 126 | 3,4 |
| 0.81 | 5.2 | 0.83 | 108 | 1,3 |
| 1.97 | 14.05 | 1.0 | 487 | 2,4 |
| 1.38 | 7.1 | 1.03 | 455 | 2,5 |
| Smallest $\|g\|^2$ | | | | |
| 0.81 | 5.2 | 0.83 | 108 | 1,3 |
| 1.05 | 5.0 | 0.79 | 126 | 3,4 |
| 3.16 | 21.3 | 3.21 | 131 | 3,9 |
| 3.10 | 14.8 | 2.00 | 161 | 6,8 |
| 4.03 | 24.3 | 2.60 | 161 | 5,9 |

Data listed in Table 1 indicate that the paired positions 1,3 (see FIG. 2 for the dipole locations) is an optimal arrangement in terms of satisfying all three criteria—homogeneity, efficiency, and stability. The 2,3 arrangement is the best in terms of homogeneity and stability, but is only marginally better than the 1,3 on these points, while it is far more inefficient, as indicated by the value of $\|g\|^2$.

Accordingly, in one embodiment, the 1,3 arrangement is chosen as the basis for the dipole strength optimization for the original PM array design. An implementation of a single-sided PM array based on the 1,3 arrangement and its performance will be described in detail in Section II-C below. To predict the overall performance, a magnetic field the array would produce at a region was calculated using finite element modeling. To create the 1,3 design, the one arbitrary unit (a.u.) of distance of 2 cm was taken for the optimization and the optimization's two-dimensional dipoles with two sets of 9 cm long rods separated from each other by 0.4 cm along the rods axial direction was approximated. The maximum radius for the rods was determined by the smaller inner rod pair overlap yielding respective inner and outer radii of 1 cm and 2 cm given the optimal coefficients.

Optimized dipole coefficients obtained for the 1,3 arrangement yield PM rod orientations of 3.5° and 24.1° from the plane connecting the dipole's centers for the inner and outer magnetizations, respectively. With this configuration, and assuming a 1.3T remnant field strength for the magnetic rods, a Comsol33 simulation indicates that a 620 Gauss, 1.9 cm³ cylindrical sensitive volume with a 16, 100 ppm homogeneity, or a 7.6 cm³ cylindrical sensitive volume with a 32, 200 ppm homogeneity can be obtained at a target volume distance centered 3.5 cm from the plane containing the center of the PM rods. Extrapolating from $|\nabla_x C|$ and $|\nabla_g C|$, the mean square deviation of the field over the target region would worsen from $0.81\times10^{-2}$ to $0.92\times10^{-2}$ and $0.85\times10^{-2}$ from the respective errors of a 5% variation of the magnetization and a 0.2 cm variation in the dipole positions.

Figure 4:
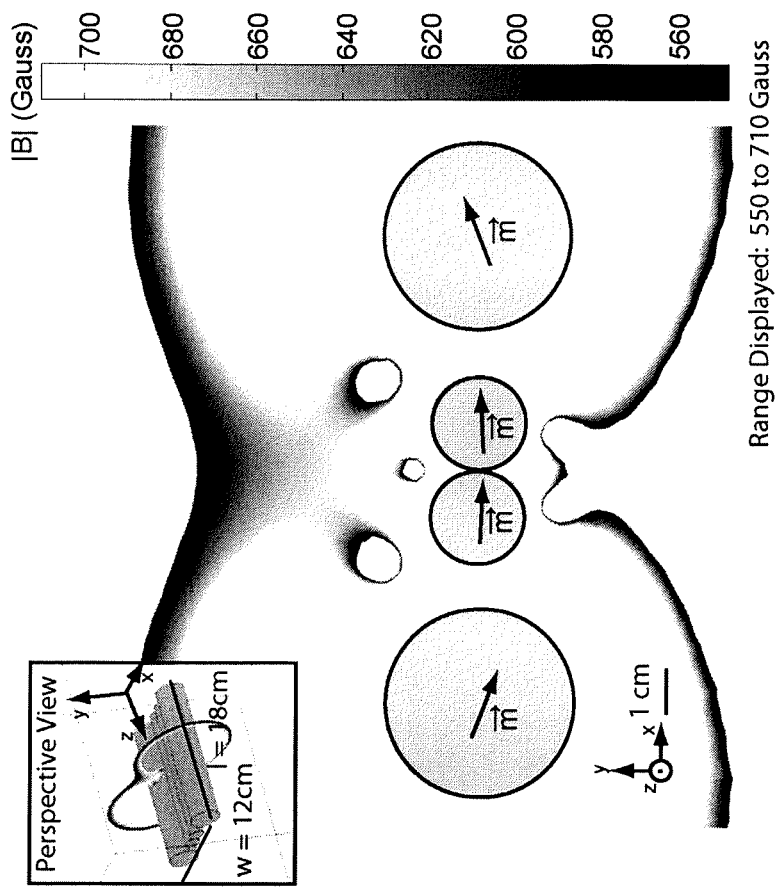
FIG. 4 shows a central slice of a simulated field arising from the optimized 1,3 arrangement (rods occupying positions 1 and 3 in FIG. 3) illustrating the field strength about the magnet's sensitive volume and an insert showing a perspective view of the arrangement.

FIG. 4 shows a central slice 400 of an simulated field arising from the optimized 1,3 arrangement (FIG. 3) illustrating the field strength about the magnet's sensitive volume and an insert showing a perspective view 410 of the arrangement. The figure shows two smaller cylindrical PM rods 401A, 401B at positions 1 and larger cylindrical PM rods 403A, 403B positioned at positions 3 (FIG. 3). The arrows shown in each of the PM rods indicate the direction of the magnetization for the PM rod. Only field values between 560 and 710 are displayed with off-scale regions shown in solid black or white.

The magnetic dipoles can be implemented with 18 cm long cylindrical PM rods so that the length of any one PM rod is significantly larger than the distance of its center to the target field. In one case, the lengths of the PM rods are slightly more than 3 times of the distance to the target region or volume. The optimal dipole coefficients and available space lead to the outer and inner radii of 2 cm and 1 cm (magnitudes of the magnetizations depend on both length and radius of the PM rod), and orientations angles with respect to the coplanar (e.g., the x-z plane) of +/−24.1° and +/−3.5°, respectively (FIG. 3). For each magnetic dipole, the magnitudes of the g coefficients (e.g., $\sqrt{g_{kx}^2+g_{ky}^2}$) can determine the radius of the cylindrical PM rod, while an arctangent of a ratio of coefficients (e.g., $\text{Tan}^{-1}[g_{kx}/g_{ky}]$) can determine the orientation angle. Comsol33 simulation indicates that this configuration with cylindrical PM rods whose remnant fields are 1.3T yields a 640 Gauss, 1.9 cm³ target volume with a 16,1000 ppm homogeneity, or a 7.6 cm³ target volume with a 32,200 ppm homogeneity at a target volume distance centered 3.5 cm from the plane containing the centers of the PM rods.

B. Movement of the Target Region by Rotation of PM rods

Once the basic design parameters such as dipole positions, magnitudes, and orientations of the PM rods are established via the unconstrained least-squares optimization method described above, further optimizations can be performed with respect to adjusting PM rods' orientations to move target or sensitive volume, for example, along depth, e.g., y direction (FIG. 4). The PM rods' orientations for a set of target regions (e.g., volumes or slices) can be determined by, for example, a series of least-squares optimizations subject to multiple quadratic equality constraints as described in Section II-A above.

Figure 5:
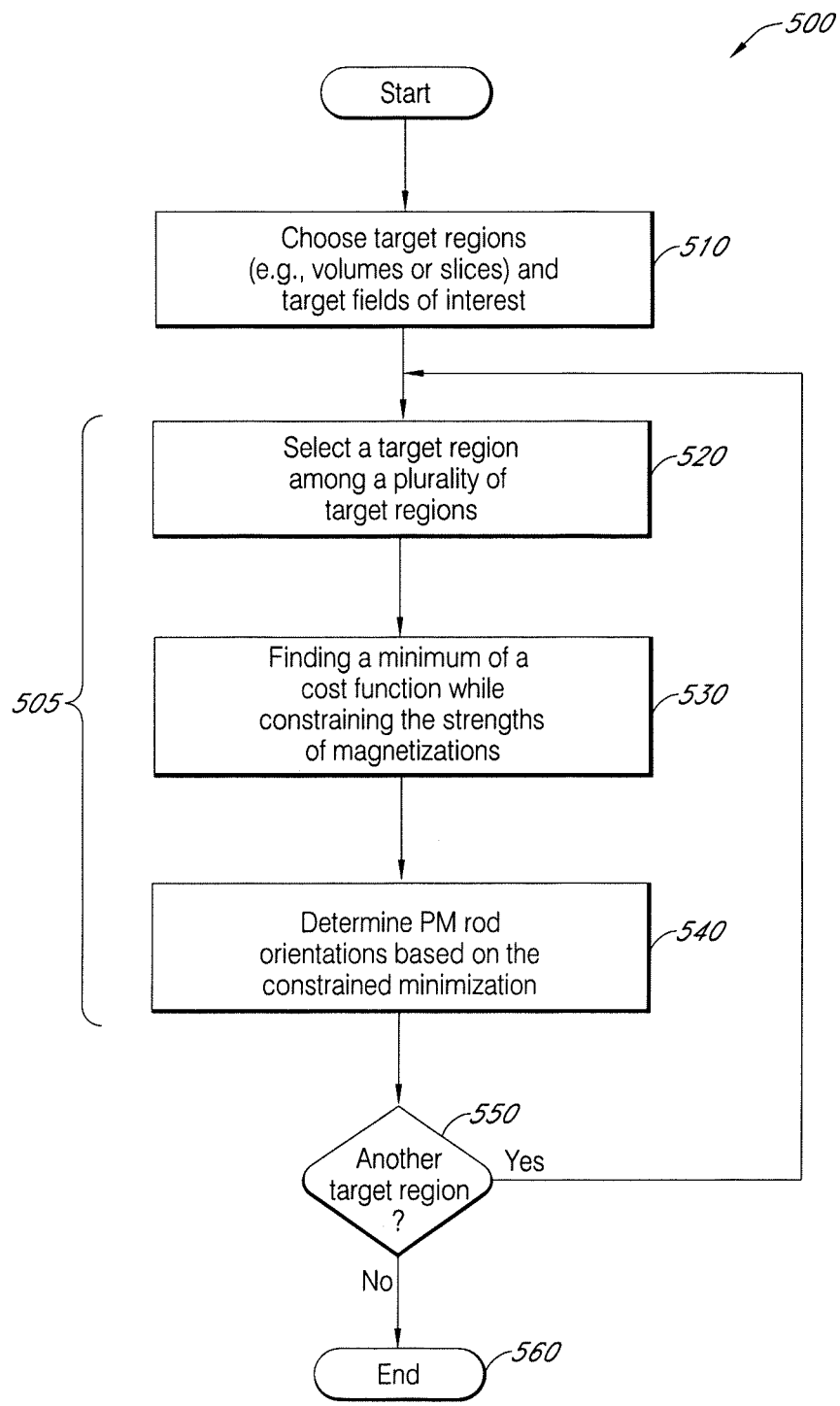
FIG. 5 shows a flowchart illustrating an example process for determining optimized PM rod orientations in a single-sided PM array based on a constrained optimization method for a plurality of adjustable target regions.

FIG. 5 shows a flowchart illustrating an example process 500 for determining optimized PM rod orientations based on a constrained optimization method for a plurality of adjustable target regions. The process 500 starts at a state 510, where target regions (e.g., target volumes or slices) of interest and target fields within the target regions are chosen. The process 500 then enters a constrained minimization or optimization loop 505 by proceeding to a state 520, where a particular target region and its associated target magnetic fields are selected among the chosen target regions. The process 500 proceeds to a state 530, where a cost function represents a norm squared of the difference between the target magnetic fields and trial magnetic fields is minimized while constraining the strengths of magnetizations corresponding to different PM rods. The cost function can measure the fit of the produced field to a desired target field. The minimization includes allowing orientations of the magnetizations to vary while constraining their absolute magnitudes. An example of the constrained optimization based on the quadratic equality constraint methodology was described above with respect to Algorithm 3. The trial magnetic fields can be expressed as a linear combination of a plurality of basis fields, where each of the basis fields represents the magnetization corresponding to one of the PM rods. Each of the basis fields can include a pair of orthogonal (e.g., $\hat{x}$ and $\hat{y}$) dipole fields and an associated pair of dipole coefficients. Constraining the strengths of the magnetizations during the minimization discussed above can include constraining a sum of squares of the pair of dipole coefficients corresponding to each of the PM rods.

Once the optimized dipole coefficients are obtained at the state 530, the process 500 proceeds to a state 540, where optimized PM rod orientations are determined based on results of the constrained minimization discussed above. Here, it is worth noting that an orientation for a PM can be computed simply from the pair (e.g., x and y) of coefficients for the PM rod, which coefficients correspond to the x and y components of the magnetization of a uniformly magnetized object, by taking an arctangent of a ratio of the coefficients, for example. Hence, a judicious choice of the x and y basis fields for expressing basis fields of PM rods can substantially facilitate the computations of the PM rod orientations. The process 500 then proceeds to a decision state 550, where it is queried whether there is another target region for which PM rod orientations are to be determined. If the answer is yes, the process 500 re-enters the constrained optimization loop 505 by looping back to the state 520, where another target region among the chosen target regions is selected and the processes described above with respect to states 530-550 repeat. If the answer at the decision state 550 is no, the process 500 ends at state 560.

Figure 6:
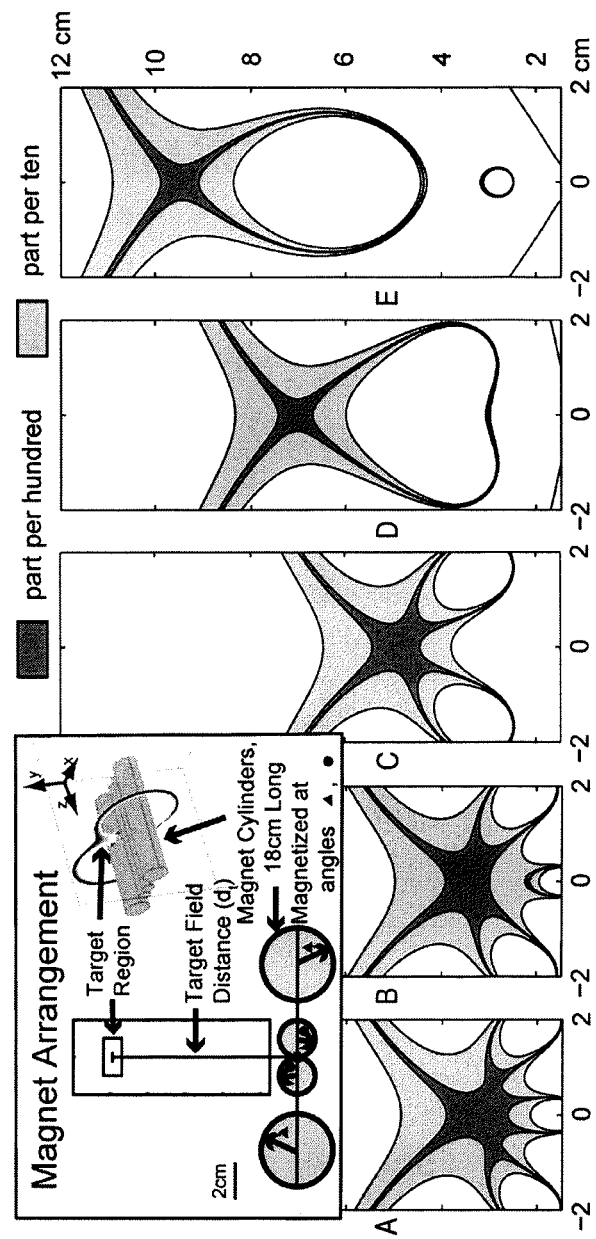
FIGS. 6A, B, C, D, and E show movable target volumes at different distances from the permanent magnet (PM) array.

In one non-limiting example of the constrained optimization discussed above (e.g., optimizations subject to the equality constraints), target fields are chosen to be identical in size (a 2 cm×1 cm slice in the plane bisecting the rod axes) and orientation ($H_x=1$) to the original non-constrained optimization discussed above with respect to the 1,3 optimized design example, but are made to vary in their distance from the PM array to produce a movable target or sensitive volume as shown in FIGS. 6-A, B, C, D, and E. The constrained optimizations can accurately model and adjust for finite rod lengths, by using the basis fields of finite rods (numerically evaluated assuming Br=1.3T). The equality constraints are necessary to use a finite rod basis, as field shape, in addition to magnitude, varies with the rod's dimensions. Each rod's orientation is then modeled by the superposition of two basis functions: one for magnetization along x and one along $\hat{y}$. The variations are restricted to rod rotations only by constraining the sum of squares of the pair of coefficients representing each rod. Since the magnitudes of the coefficients are fixed and unable to adjust the target field strength of the target field, the optimization adjusts the target field strength to minimize the perturbation to the original cost function. The technique's implementation is described in Algorithm 3 below:

Algorithm 3
Optimizing with Multiple Quadratic Constraints.

1: Generate the constraint matrices and scalars, $K_j$ and $\alpha_k$.
2: Calculate the target field matrix and vector, M and m , from (5).
3: while the constraints (8) are not obeyed. do
4:     Calculate the first order Lagrange multiplier solver matrices and vectors: L, A and ρ from (13).
5:     Find the first order approximations to the Lagrange multiplier solution vectors $\lambda_p$ and $\lambda_A$ from (16).
6:     Determine the relative field-strength s which allows for the minimal applied constraint from (17).
7:     if $\lambda_\alpha \cdot \lambda_p \leq 0$, then
8:         Quit. Inform the user of the condition and return the previous iteration's solution for λ and $g_{opt}$
9:     end if
10:    Calculate the Lagrange multiplier, λ, as in (16).
11:    Add in the Lagrange multipliers into the solution matrix, M . See (14). {This new matrix now replaces the previous one for future loop iterations.}
12:    Calculate the optimal coefficients. $g_{opt} = M^{-1}(sm)$ .
13: end while The constrained optimization procedure of Algorithm 3 performed on the 1,3 design can produce target regions defined by sensitive volumes over a range of distances from the PM array by simply changing dipole (e.g., PM rod magnetization) orientations. As an example, a PM array constructed according to the optimized 1,3 design such as the single-sided PM array shown in FIG. 4, can produce a series of optimized target regions (e.g., sensitive volumes or slices) such as shown in FIGS. 6A-6E at varying distances from the PM array by allowing the PM rods to rotate. For example, the dipole magnitudes and positions are constrained to their optimal values determined from the original single-sided magnet optimization such as the configuration shown in FIG. 4, while target fields that span a range of distances from the four PM block array are optimized via the optimizations subject to the equality constraints, an example procedure of which is described in Algorithm 3. The target fields cover regions 2 cm wide 1 cm high, have unit strength and are directed parallel to the array's surface, as in the earlier single-sided magnet optimizations. The example procedure employs a variant of the constrained optimization where the scalar magnitude of the target field is also optimized because the array tends to produce target regions of varying strengths depending on their distance from the array. Table 2 shown below lists various relevant parameters such as target region distances (distance of target region's center to the plane containing the PM rod axes), field strengths, (from 18 cm PM rods), outer PM rod orientation angles, and inner PM rod orientation angles associated with FIGS. 6A-6E. The orientation angles are as defined in the insert of FIGS. 6A-6E.

TABLE 2

|  | FIG. 6A | FIG. 6B | FIG. 6C | FIG. 6D | FIG. 6E |
|---|---|---|---|---|---|
| Target region distance | 2.9 cm | 3.5 cm | 5.1 cm | 7.1 cm | 9.5 cm |
| Field strength | 711 Gauss | 666 Gauss | 373 Gauss | 220 Gauss | 107 Gauss |
| Outer PM rod orientations (in degrees) | −23.9 | −23.1 | −4.3 | 5.5 | 20.9 |
| Inner PM rod orientations (in degrees) | 0.6 | −1.5 | −45.1 | −34 | −25.1 |

FIG. 7A shows a set of three slices of a sensitive volume's field map arising from an implementation of one of the optimal angles for one target volume. FIG. 7B shows a set of three slices of a sensitive volume's field map arising from an implementation of the optimal angles of a more distant target volume (1 cm). In the examples shown, the sensitive volume size is approximately constant when it is moved further away from the original target region, while its shape is altered. As the field plots indicate, each of the target regions defined by the sensitive volumes has a substantial depth. This fact allows for a NMR/MRI measurement at a target volume as opposed to a series of measurements at a plurality of target slices.

Figure 8:
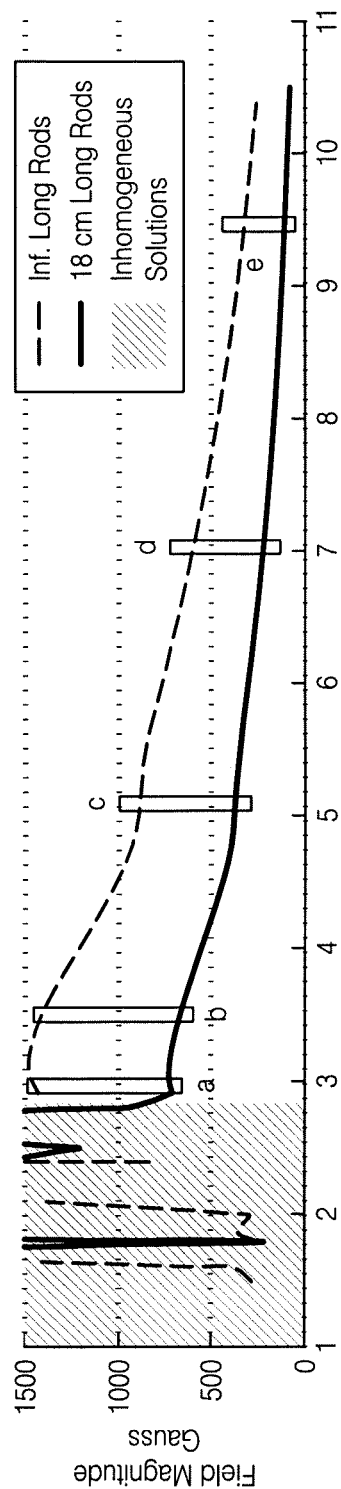
FIG. 8 shows an illustrative plot of optimal field strengths as a function of target region or field distance from the dipole centers, arising from dipole angle optimizations using a quadratic equality constraints methodology.

FIG. 8 shows a plot (solid line) of optimal field strengths or magnitudes due to 18 cm long PM rods as a function of target region or field distance from the dipole centers arising from dipole angle optimizations using the quadratic equality constraints methodology discussed above. FIG. 8 also shows a plot (broken line) corresponding to field strengths of infinitely long PM rods. These plots illustrate that finite length PM rods produce sensitive volumes with field strengths that are a fraction of their infinite length equivalents which decrease with distance (~50% at $d_r$=3.0 cm vs ~40% at $d_r$=10.5 cm.)

Figure 9:
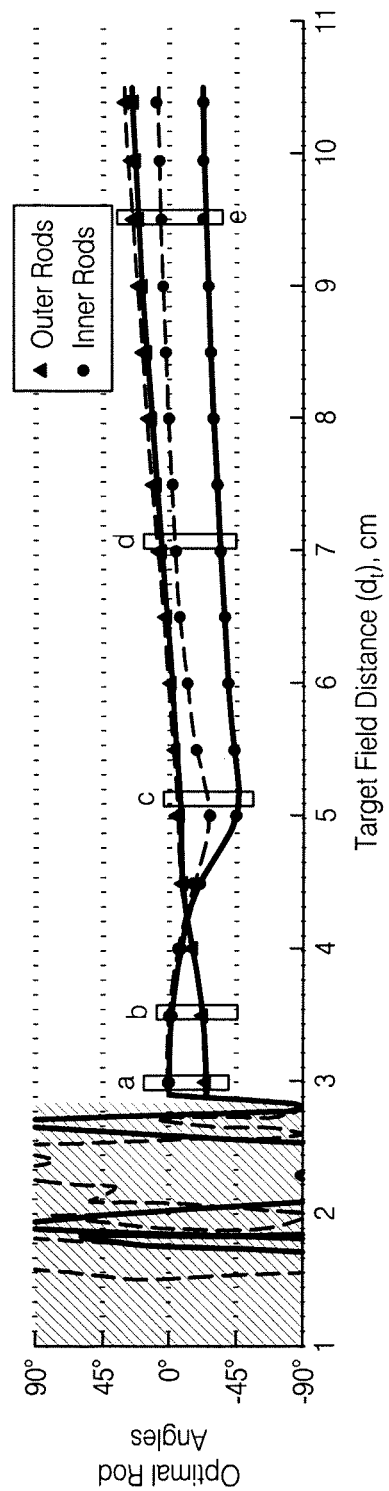
FIG. 9 shows a plot of optimal dipole orientations as a function of target region distance from the dipole centers.

FIG. 9 shows a plot of optimal magnetization or dipole orientations as a function of target region distance from the dipole centers. The optimal dipole angles as a function of target region distance was computed using the quadratic equality constraint optimization methodology using the optimal 1,3 system's dipole positions and magnitudes. The optimal angles for the 4 dipoles can be described with only 2 numbers due to symmetry. The plot illustrate that PM array is capable of producing sensitive volumes with gradually decreasing fields with increasing distance by only altering magnetization angles (e.g., PM rod orientations).

Figure 10:
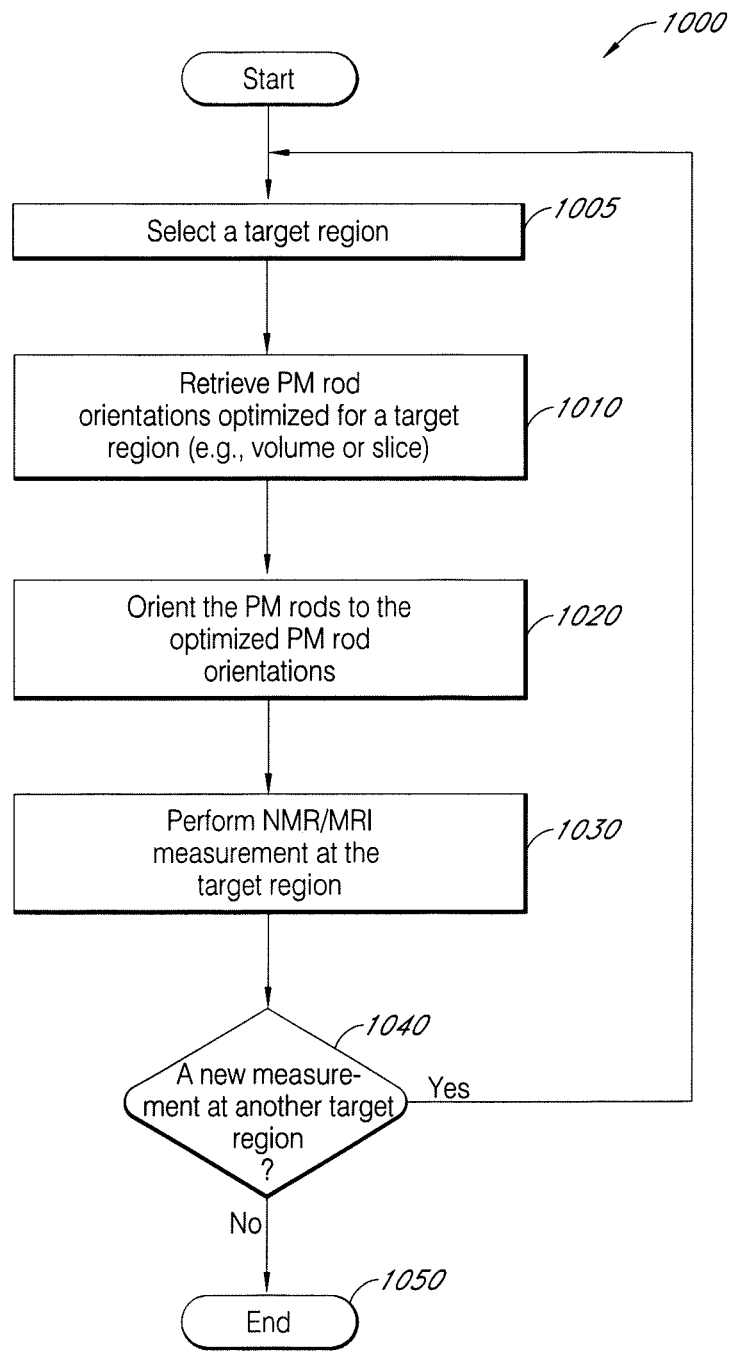
FIG. 10 shows a flowchart illustrating an example process for retrieving and using stored PM rod orientations for adjusting a target region to one or more discrete target regions for NMR/MRI measurements.

In some embodiments, the various PM rod orientations for different target regions, such as determined by the process described above with respect to FIG. 9, are saved in a data storage device such as a hard disk, flash memory, or read-only-memory (ROM), for example during or after the example process 900. FIG. 10 shows a flowchart illustrating an example process 1000 for retrieving and using stored PM rod orientations for adjusting a target region to one or more discrete target regions for NMR/MRI measurements. The process 1000 begins at a state 1005, where a target region for NMR/MRI measurement is selected. The target region can be a slice or a volume depending on the experimental methodology employed. The process 1000 proceeds to a state 1010, where optimized PM rod orientations for the selected target region are retrieved from a data storage device such as a computer memory. In certain embodiments, the optimized PM rod orientations were previously determined from a constrained optimization process such as the example process 900 describe above and saved in the data storage device. The process 1000 proceeds to a state 1020, where PM rods for a single-sided PM array, such as the one shown in FIG. 3A, are oriented to or along the retrieved optimized PM orientations. In some embodiments, the PM rod orientations at the state 1020 can be performed by a processor (e.g., a computer, a workstation, a microprocessor, a microcontroller) controlling different servo motors that can rotate different PM rods directly or via gears and/or worm drives such as discussed above with respect to FIGS. 3B and 3C above for example.

The process 1000 proceeds to a state 1030, where a NMR/MRI measurement is performed at the selected target region. The NMR/MRI measurement can include an application of a radio frequency (RF) excitation pulse by the use of a RF coil. In some embodiments, the RF coil can be a flat coil comprising multiple loops of conductors such as copper wires. In some embodiment, the RF coil can produce an RF magnetic field substantially along y direction and rotate or tip spins magnetized along the target fields on the x-z plane, for example (FIG. 2). The NMR/MRI measurement can further include an application of a gradient field to spatially encode the NMR signals. The gradient field can be generated by a gradient coil that is implemented or realized as one or more loops of conductive traces in a printed circuit board (PCB), for example. Such as PCB-based gradient coil and/or the flat RF coil can be positioned inside or in close proximity to a glass cover of the single-sided PM array between the array and an imaging object. In one embodiment, the RF coil and the gradient coil can be implemented or realized in the same coil driven simultaneously by a RF pulse generator and a gradient pulse generator. It will be appreciated that any number of coil designs may be used to generate RF pulses and gradient pulses. The process 1000 proceeds to a decision state 1040, where it is queried whether there is to be a new measurement at another target region. If the answer is yes, the process 1000 loops back to the state 1005, where another target region is selected and the process moves through the states 1010, 1020, 1030 as described above. If the answer for the decision state 1040 is no, the process 1000 ends at state 1050.

Figure 11:
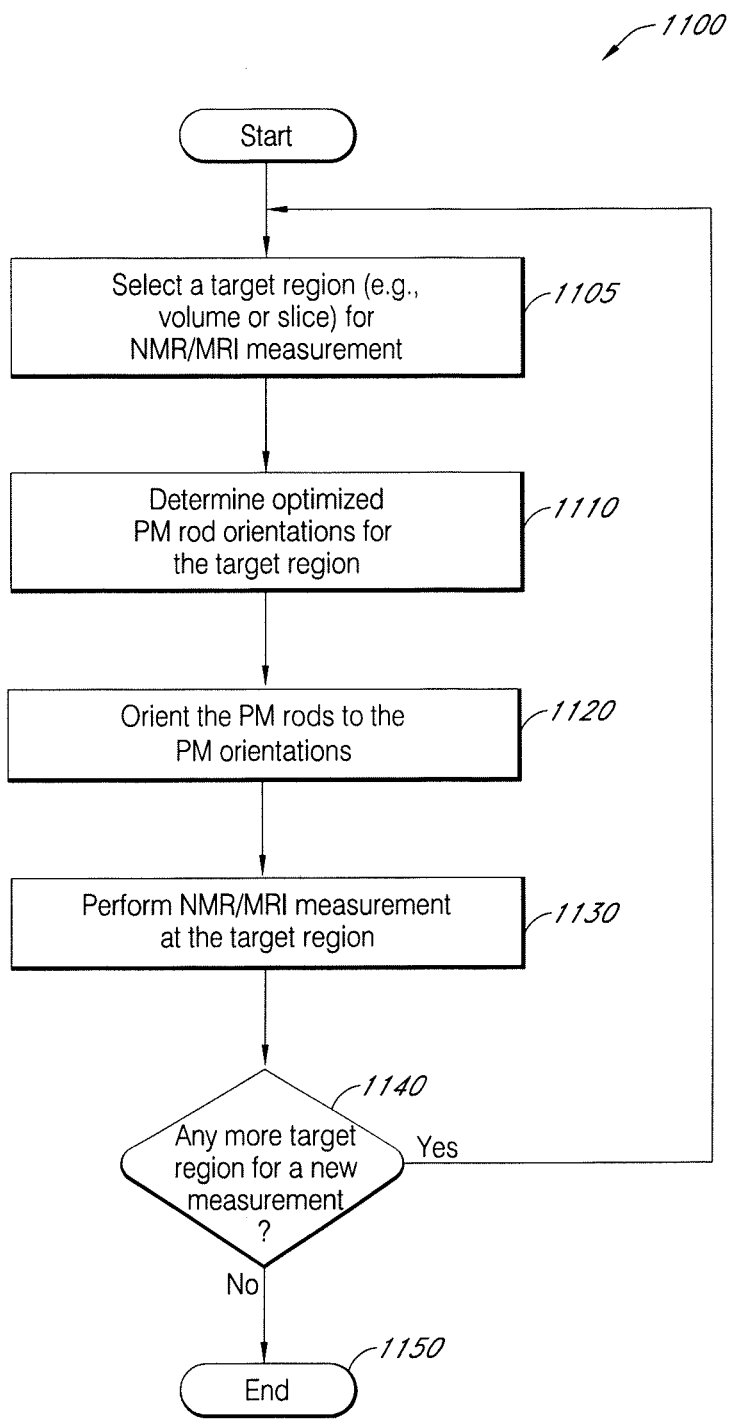
FIG. 11 shows a flowchart illustrating an example process for computing PM rod orientations in real-time for adjusting target regions for NMR/MRI measurements.

Instead of relying on previously determined and saved optimized PM rod orientations for NMR/MRI measurements at different target regions as discussed above with respect to FIG. 10, optimization of the PM rod orientations can be performed in real-time, e.g., between selecting different target regions. This real-time optimization can advantageously allow NMR/MRI to be done at an arbitrary target region rather than at discrete target regions where the optimized PM rod orientations are determined. FIG. 11 shows a flowchart illustrating an example process 1100 for computing PM rod orientations in real-time for adjusting target regions for NMR/MRI measurements. The process 1100 begins at a state 1105, where a target region for a new NMR/MRI measurement is selected. The target region can be a slice or a volume depending on the experimental methodology employed. The process 1100 proceeds to a state 1110, where optimized PM rod orientations for the selected target region are determined, for example, by a magnetic-field optimization process such as the constrained optimization method described with respect to FIG. 9 above. The process 1100 proceeds to a state 1120, where PM rods for a single-sided PM array, such as the one shown in FIG. 3A, are oriented to or along the newly determined optimized PM orientations.

The process 1000 proceeds to a state 1130, where a NMR/MRI measurement is performed at the selected target region. The process 1000 proceeds to a decision state 1140, where it is queried whether there is to be a new measurement at another target region. If the answer is yes, the process 1100 loops back to the state 1105, where another target region is selected and the process moves through the states 1110, 1120, 1130 as described above. If the answer for the decision state 1140 is no, the process 1100 ends at state 1150.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A magnetic resonance imaging (MRI) method comprising:
    providing an array of permanent magnets to one side of an imaging object;
    selecting a target region;
    rotating a plurality of elongated permanent magnets about substantially parallel axes of rotation extending longitudinally through the elongated permanent magnets to one or more orientations to move a desired magnetic field sensitive volume from a first target region to the selected target region, wherein the selected target region comprises a magnetic field having +/−1% homogeneity; and
    performing an MRI measurement of the imaging object at the selected target region.

2. The method of claim 1, further comprising using substantially all resonance frequencies within the selected target region to selectively perform MRI within the target region.

3. The method of claim 1, wherein the one or more permanent magnet include magnetizations that are substantially perpendicular to the one or more axes of the rotation.

4. The method of claim 1, wherein at least one of the permanent magnets include a cylindrical permanent magnet (PM) rod.

5. The method of claim 1, wherein the one or more orientations are predetermined after selecting the target region.

6. The method of claim 1, wherein the one or more orientations are predetermined before selecting the target region.

7. The method of claim 6, wherein the one or more predetermined orientations are stored in a memory.

8. The method of claim 1, wherein the plurality of elongated permanent magnets include magnetizations that are substantially perpendicular to the axes of rotation extending longitudinally through the elongated permanent magnets.

9. A magnetic resonance imaging (MRI) device comprising:
    an array of permanent magnets that are configured to rotate about one or more axes of rotation, wherein the array of permanent magnets include a plurality of elongated permanent magnets configured to rotate about substantially parallel axes of rotation extending longitudinally through the elongated permanent magnets;
    a processor configured to:
        select a target region;
        command one or more permanent magnets to one or more orientations to move a desired magnetic field sensitive volume from a first target region to the selected target region, wherein the selected target region comprises a magnetic field having +/−1 homogeneity; and
        perform an MRI measurement at the selected target region.

10. The MRI device of claim 9, wherein the array of permanent magnets includes four cylindrical permanent magnet (PM) rods.

11. The MRI device of claim 10, wherein the four cylindrical permanent magnet (PM) rods include magnetizations that are substantially perpendicular to the axes of rotation thereof.

12. The MRI device of claim 11 further comprising one or more servo motors that are configured to rotate one or more PM rods to the predetermined orientations at the command of the processor.

13. The MRI device of claim 9, further comprising a radio frequency (RF) coil disposed between the array of permanent magnets and the target region.

14. The MRI device of claim 13, wherein the RF coil is a flat coil comprising one more or more windings of conductors.

15. The MRI device of claim 9, further comprising a gradient coil disposed between the array of permanent magnets and the target region.

16. The MRI device of claim 15, wherein the gradient coil comprises one or more conductive traces in a printed circuit board (PCB).

17. The MRI device of claim 9, wherein the device is portable.

18. The method of claim 9, wherein the plurality of elongated permanent magnets include magnetizations that are substantially perpendicular to the axes of rotation extending longitudinally through the elongated permanent magnets.

* * * * *